US012604510B2

(12) United States Patent
Xie et al.

(10) Patent No.: US 12,604,510 B2
(45) Date of Patent: Apr. 14, 2026

(54) CONTACT JUMPER FOR NON-SELF ALIGNED CONTACT DEVICES

(71) Applicant: International Business Machines Corporation, Armonk, NY (US)

(72) Inventors: Ruilong Xie, Niskayuna, NY (US);
Julien Frougier, Albany, NY (US);
Min Gyu Sung, Latham, NY (US);
Heng Wu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 703 days.

(21) Appl. No.: 17/941,248

(22) Filed: Sep. 9, 2022

(65) Prior Publication Data

US 2024/0088241 A1     Mar. 14, 2024

(51) Int. Cl.
| | |
|---|---|
| *H10D 64/23* | (2025.01) |
| *H01L 23/522* | (2006.01) |
| *H10D 30/67* | (2025.01) |
| *H10D 62/10* | (2025.01) |
| *H10D 84/83* | (2025.01) |
| *H10W 20/42* | (2026.01) |

(52) U.S. Cl.
CPC ....... *H10D 64/258* (2025.01); *H10D 30/6735* (2025.01); *H10D 30/6757* (2025.01); *H10D 62/121* (2025.01); *H10D 84/83* (2025.01); *H10W 20/42* (2026.01)

(58) Field of Classification Search
CPC ............ H01L 23/5226; H10D 30/6735; H10D 30/6757; H10D 62/121; H10D 84/83; H10D 84/0149
See application file for complete search history.

(56) References Cited

U.S. PATENT DOCUMENTS

| | | | |
|---|---|---|---|
| 9,147,576 B2 | 9/2015 | Horak et al. | |
| 9,412,840 B1 | 8/2016 | Leobandung et al. | |
| 9,786,660 B1 | 10/2017 | Farrell et al. | |
| 9,929,048 B1 | 3/2018 | Xie et al. | |
| 9,941,278 B2 | 4/2018 | Labonte et al. | |
| 10,319,668 B2 | 6/2019 | Do et al. | |
| 10,446,653 B2 | 10/2019 | Xie et al. | |
| 10,665,692 B2 | 5/2020 | Xie et al. | |
| 10,770,388 B2 | 9/2020 | Xie et al. | |
| 10,832,964 B1 | 11/2020 | Xie et al. | |
| 10,930,568 B1 | 2/2021 | Xie et al. | |
| 11,205,723 B2 | 12/2021 | Rahman et al. | |
| 2002/0093071 A1* | 7/2002 | Chheda ............ | H01L 21/76229 |
| | | | 257/E21.548 |

(Continued)

OTHER PUBLICATIONS

M. Carmona et al., "Study of Gate Contact Over Active Area," 29th Symposium on Microelectronics Technology 1 and Devices, Sep. 2014, 4 pages.

*Primary Examiner* — Jeff W Natalini
*Assistant Examiner* — Rose Keagy
(74) *Attorney, Agent, or Firm* — L. Jeffrey Kelly; Ryan, Mason & Lewis, LLP

(57) ABSTRACT

A semiconductor structure includes a first source/drain contact disposed between a first gate structure and a second gate structure, a dielectric cap disposed on the first source/drain contact, and a first gate contact disposed over the dielectric cap. The first gate contact connects the first gate structure with the second gate structure.

20 Claims, 15 Drawing Sheets

(56) References Cited

U.S. PATENT DOCUMENTS

2014/0077305 A1* 3/2014 Pethe ..................... H10D 30/62
                                                          257/E21.409
2020/0090999 A1* 3/2020 Hsu ....................... H01L 23/528
2020/0335401 A1* 10/2020 Fan ........................ H10D 62/83
2021/0225766 A1* 7/2021 You ................... H01L 21/31111

* cited by examiner

CONTACT JUMPER FOR NON-SELF ALIGNED CONTACT DEVICES

BACKGROUND

In the course of semiconductor integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

SUMMARY

Illustrative embodiments of the present application include techniques for use in semiconductor manufacture. In one illustrative embodiment, a semiconductor structure comprises a first source/drain contact disposed between a first gate structure and a second gate structure, a dielectric cap disposed on the first source/drain contact, and a first gate contact disposed over the dielectric cap. The first gate contact connects the first gate structure with the second gate structure.

In another illustrative embodiment, a semiconductor structure comprises a dielectric cap disposed in a source/drain contact, and a gate contact disposed on the dielectric cap. A width of a bottom surface of the gate contact is less than a width of a top surface of the dielectric cap.

In yet another illustrative embodiment, a semiconductor structure comprises a first source/drain contact disposed between a first gate structure and a second gate structure, a dielectric cap disposed on the first source/drain contact, the dielectric cap extending above a top surface of the first gate structure and the second gate structure, and a gate contact jumper connecting the first gate structure with the second gate structure. A portion of the gate contact jumper is disposed over the dielectric cap.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figures 1A, 1B:
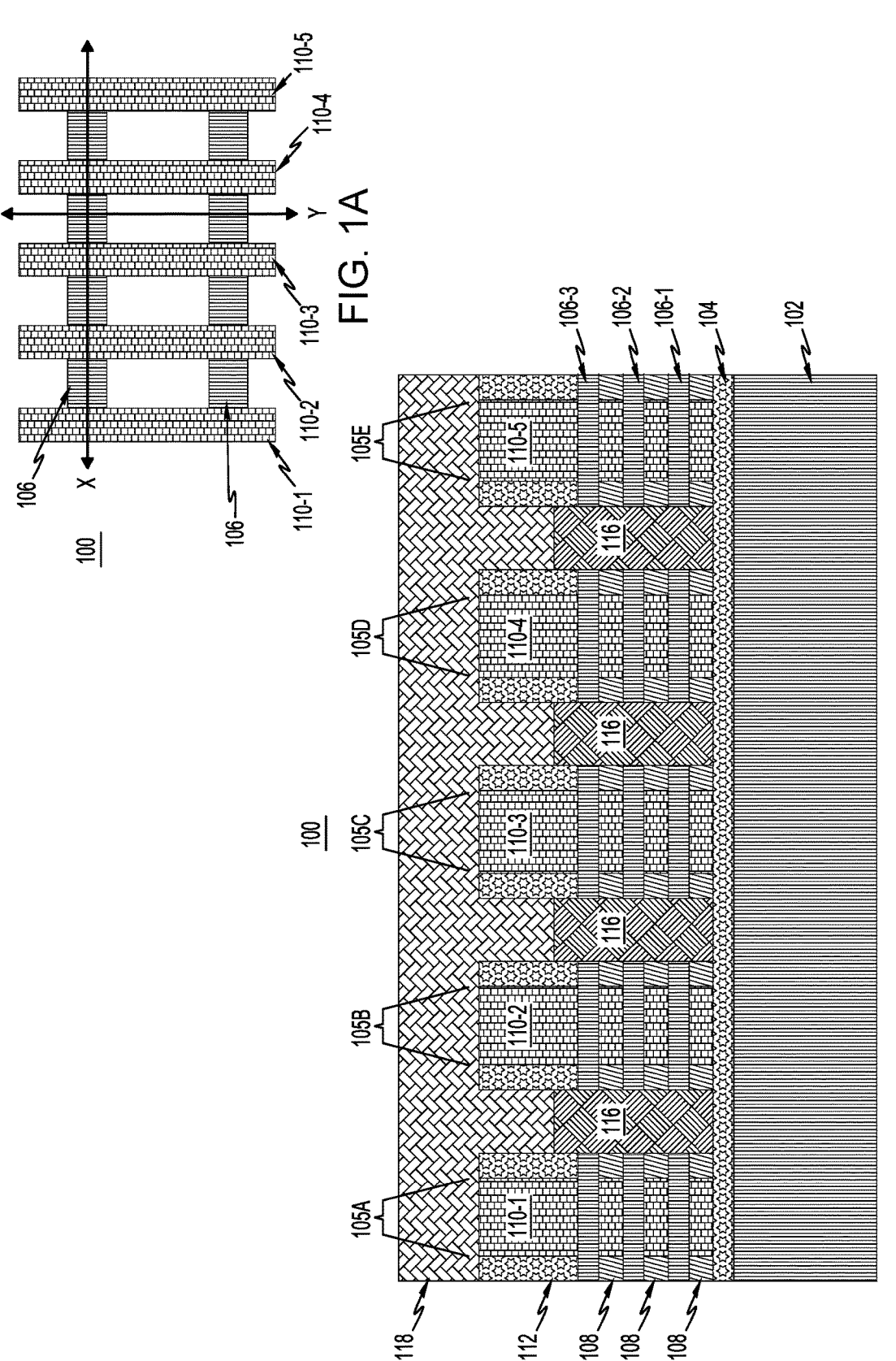
FIG. 1A is a top view illustrating a semiconductor structure for use at a first-intermediate fabrication stage, according to an illustrative embodiment.
FIG. 1B is a cross-sectional view of the semiconductor structure taken along the X-X axis of FIG. 1A at the first-intermediate fabrication stage, according to an illustrative embodiment.

Illustrative embodiments of the invention may be described herein in the context of illustrative methods for forming semiconductor structures with a contact jumper for non-self aligned contact semiconductor devices, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

Semiconductor devices are being manufactured using non-self-aligned contacts (non-SACs) due to simpler manufacturing processes and lower cost. However, as semiconductor devices such as, for example, complementary metal-oxide semiconductor (CMOS) devices are continuously being scaled down to smaller dimensions, non-SAC processes are difficult to implement. For example, it is difficult to implement a gate contact over an active region with non-SAC source/drain and gate contacts. Accordingly, non-limiting illustrative embodiments described herein overcome the above drawbacks discussed above, by utilizing a gate contact jumper for non-SAC semiconductor devices.

It is to be understood that the various layers and/or regions shown in the accompanying drawings are not drawn to scale, and that one or more layers and/or regions of a type commonly used in, for example, field-effect transistor (FET), FinFET, VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the terms "about" or "substantially" as used herein imply that a small margin of error may be present, such as 1% or less than the stated amount.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Referring now to the drawings in which like numerals represent the same of similar elements, FIGS. 1A-7C illustrate various processes for fabricating non-SAC semiconductor devices with a contact jumper. Note that the same reference numeral (100) is used to denote the semiconductor structure through the various intermediate fabrication stages illustrated in FIGS. 1A through 7C. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1A-7C are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Figure 1C:
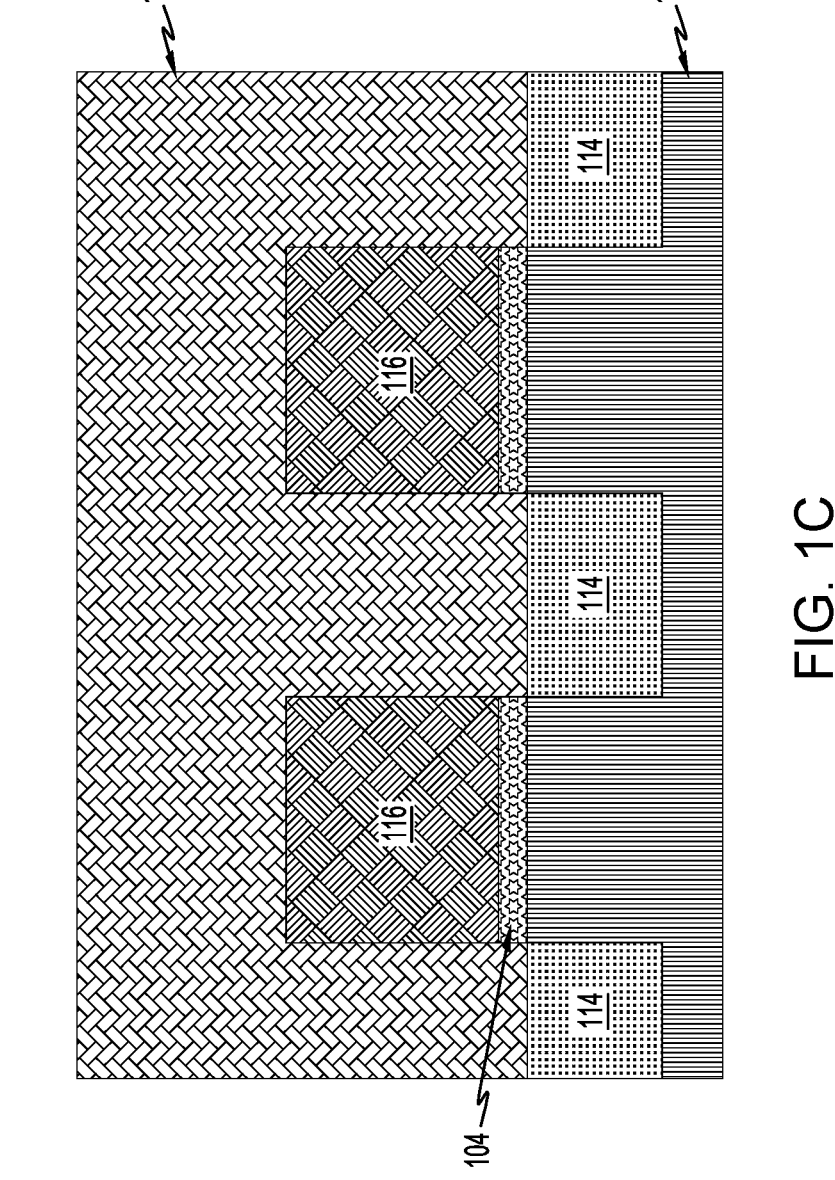
FIG. 1C is a cross-sectional view of the semiconductor structure taken along the Y-Y axis of FIG. 1A at the first-intermediate fabrication stage, according to an illustrative embodiment.

FIG. 1A is a top view illustrating a semiconductor structure 100 for use at a first-intermediate fabrication stage. FIG. 1B is a cross-sectional view of the semiconductor structure 100 taken along the X-X axis of FIG. 1A at the first-intermediate fabrication stage. FIG. 1C is a cross-sectional view of the semiconductor structure 100 taken along the Y-Y axis of FIG. 1A at the first-intermediate fabrication stage.

Semiconductor structure 100 includes a substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

Nanosheets are initially formed over the substrate 102, where the nanosheets initially include sacrificial layers (not shown), nanosheet channel layers 106-1, 106-2 and 106-3 (collectively, nanosheet channel layers 106). The sacrificial layers can be illustratively formed of different sacrificial materials, such that they may be etched or otherwise removed selective to one another. In some embodiments, the sacrificial layers are formed of SiGe, but with different percentages of Ge. For example, given ones of the sacrificial layers may have a relatively higher percentage of Ge (e.g., 55% Ge), and other given ones of the sacrificial layers may have a relatively lower percentage of Ge (e.g., 25% Ge). Other combinations of different sacrificial materials may be used in other embodiments. The nanosheet channel layers 106 may be formed of Si or another suitable material (e.g., a material similar to that used for the substrate 102).

The nanosheets are then patterned for formation of shallow trench isolation (STI) regions 114 and FET devices 105A, 105B, 105C, 105D and 105E. The STI regions 114 may comprises a dielectric material such as silicon oxide or silicon oxynitride, and is formed by methods known in the art. For example, in one illustrative embodiment, STI regions 114 are a shallow trench isolation oxide layer. In addition, the number of FET devices should not be considered limiting and any number are contemplated. The FET devices may comprise nFET devices and other ones of the FET devices may comprise pFET devices.

Following semiconductor processing, the semiconductor structure 100 further includes a bottom dielectric insulator (BDI) layer 104, inner spacers 108, gate stack layers 110-1, 110-2, 110-3, 110-4 and 110-5 (collectively, gate stack layers 110) for each respective FET device, sidewall spacers 112, and source/drain regions 116. The BDI layer 104 may be formed of any suitable insulator, such as SiN, silicon boron carbide nitride (SiBCN), silicon oxycarbonitride (SiOCN), etc. The BDI layer 104 is formed in the region previously occupied by a sacrificial layer, and may have similar sizing as the sacrificial layers.

The inner spacers 108 may be formed to fill indent spaces (e.g., resulting from indent etches of the sacrificial layers prior to their removal). The inner spacers 108 may be formed of silicon nitride (SiN) or another suitable material such as SiBCN, silicon carbide oxide (SiCO), SiOCN, etc.

The gate stack layer 110 may comprise a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer may have a uniform thickness in the range of 1 nm to 3 nm.

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

The sidewall spacers 112 may be formed of materials similar to that of the BDI layer 104.

The source/drain region 116, as noted above, may be formed using epitaxial growth processes, and thus may also be referred to as epitaxial layers 116. The source/drain region 116 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl).

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

An interlayer dielectric (ILD) layer 118 is formed on source/drain regions 116, and over the top of the semiconductor structure 100 followed by planarization using chemical mechanical planarization (CMP) or any other suitable planarization process. The ILD layer 118 may be formed of any suitable isolating material, such as $SiO_2$, SiOC, SiON, etc.

Figure 2A:
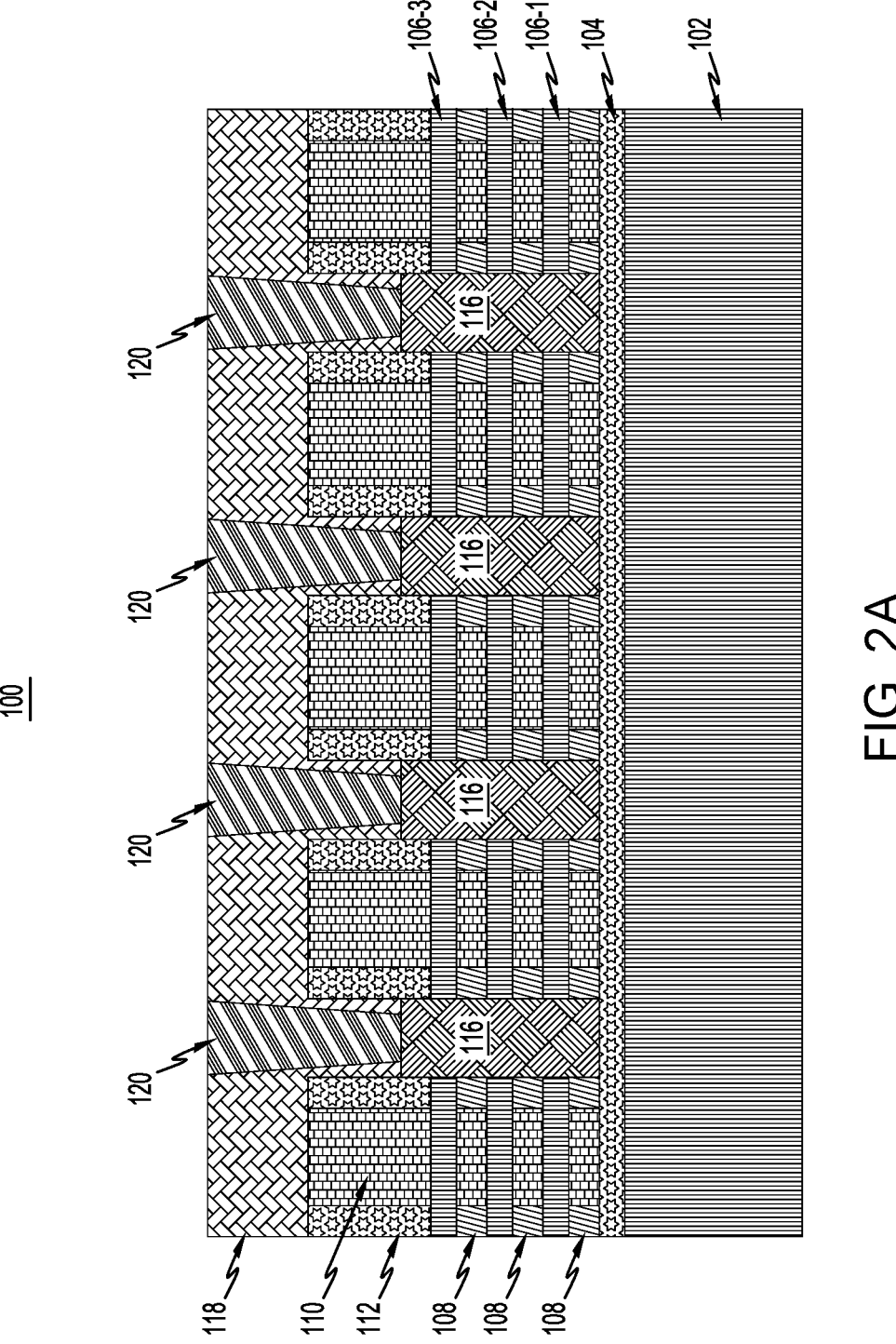
FIG. 2A is a cross-sectional view of the semiconductor structure taken along the X-X axis of FIG. 1A at a second-intermediate fabrication stage, according to an illustrative embodiment.
Figure 2B:
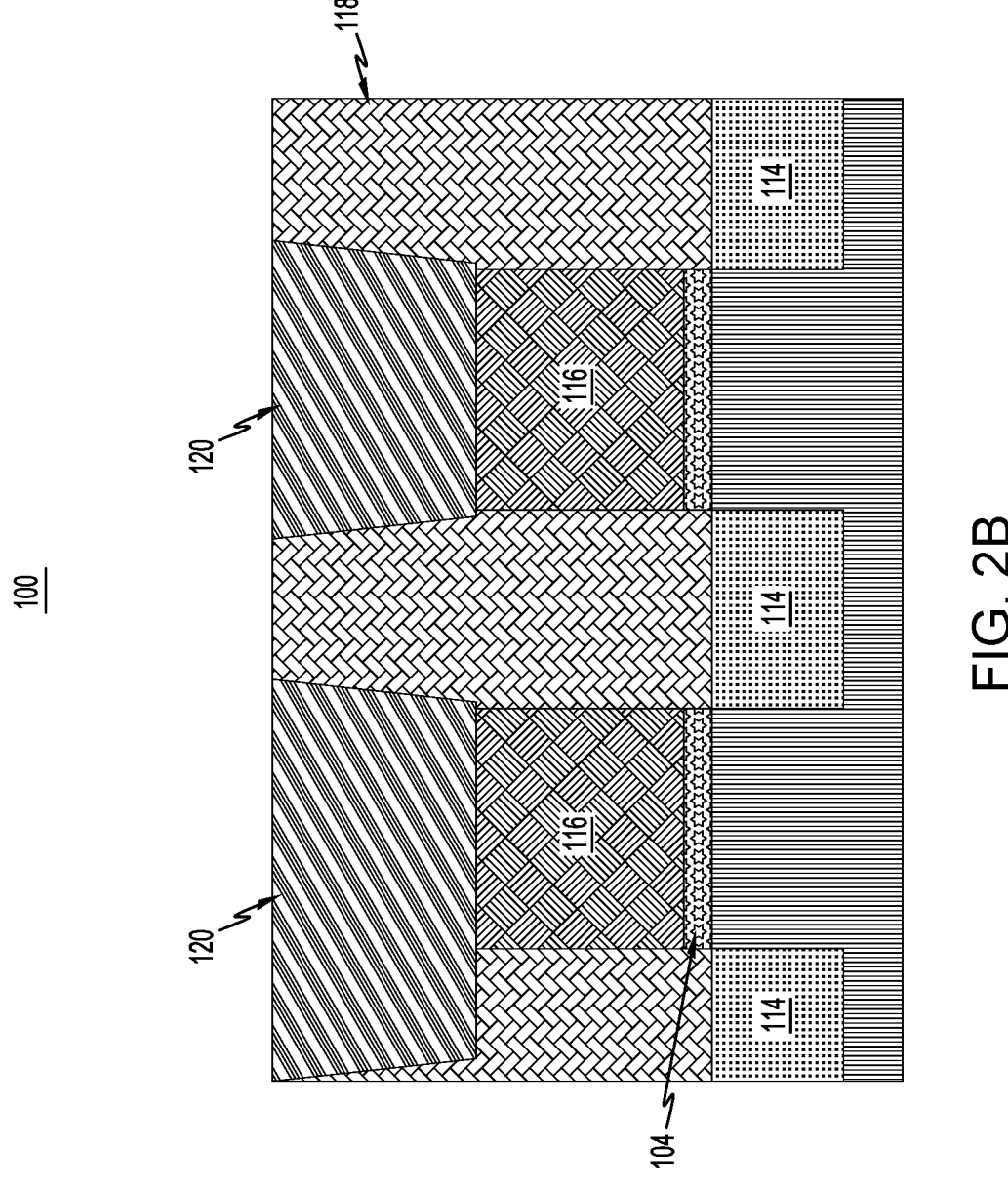
FIG. 2B is a cross-sectional view of the semiconductor structure taken along the Y-Y axis of FIG. 1A at the second-intermediate fabrication stage, according to an illustrative embodiment.

FIGS. 2A and 2B are a cross-sectional view of the semiconductor structure 100 at the second-intermediate fabrication stage. During this stage, middle-of-the-line (MOL) contacts including source/drain contacts 120 are formed by any conventional technique. For example, source/drain contacts 120 can be formed by patterning ILD layer 118 and utilizing conventional lithographic and etching processes to form a via. Next, contact metals are formed, which comprise a silicide liner, such as Ti, Ni, NiPt, etc, an adhesion metal liner, such as TiN and a high conductance metal, for example, tungsten (W), aluminum (Al), copper (Cu), cobalt (Co), ruthenium (Ru), molybdenum (Mo), or any other suitable conductive material. In various embodiments, the high conductance metal can be deposited by physical vapor deposition (PVD), atomic layer deposition (ALD), chemical vapor deposition (CVD) and/or plating. The high conductance metal can be planarized using, for example, a planarizing process such as CMP. Other planarization processes can include grinding and polishing.

Figure 3A:
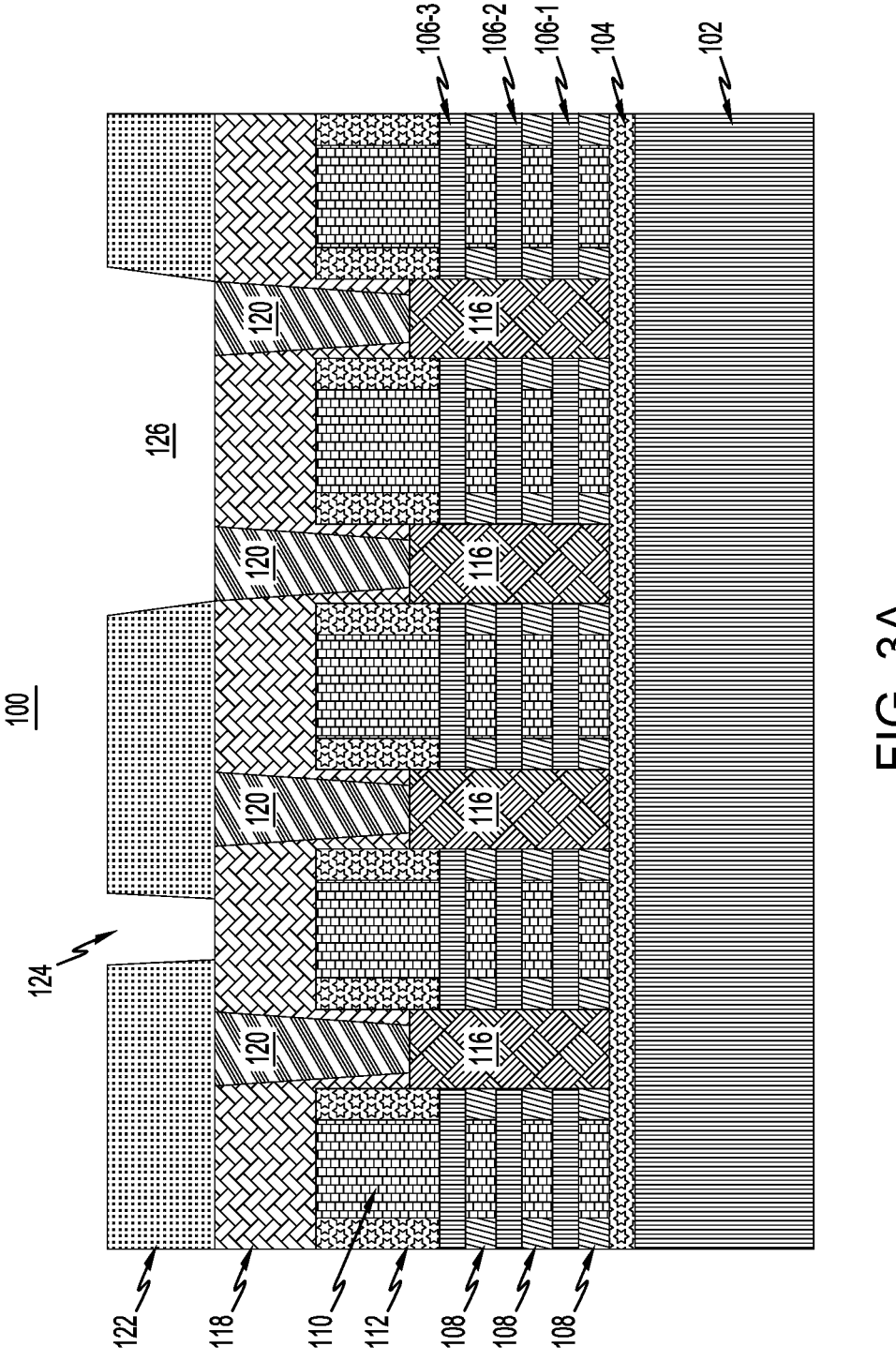
FIG. 3A is a cross-sectional view illustrating the semiconductor structure taken along the X-X axis of FIG. 1A at a third-intermediate fabrication stage, according to an illustrative embodiment.
Figure 3B:
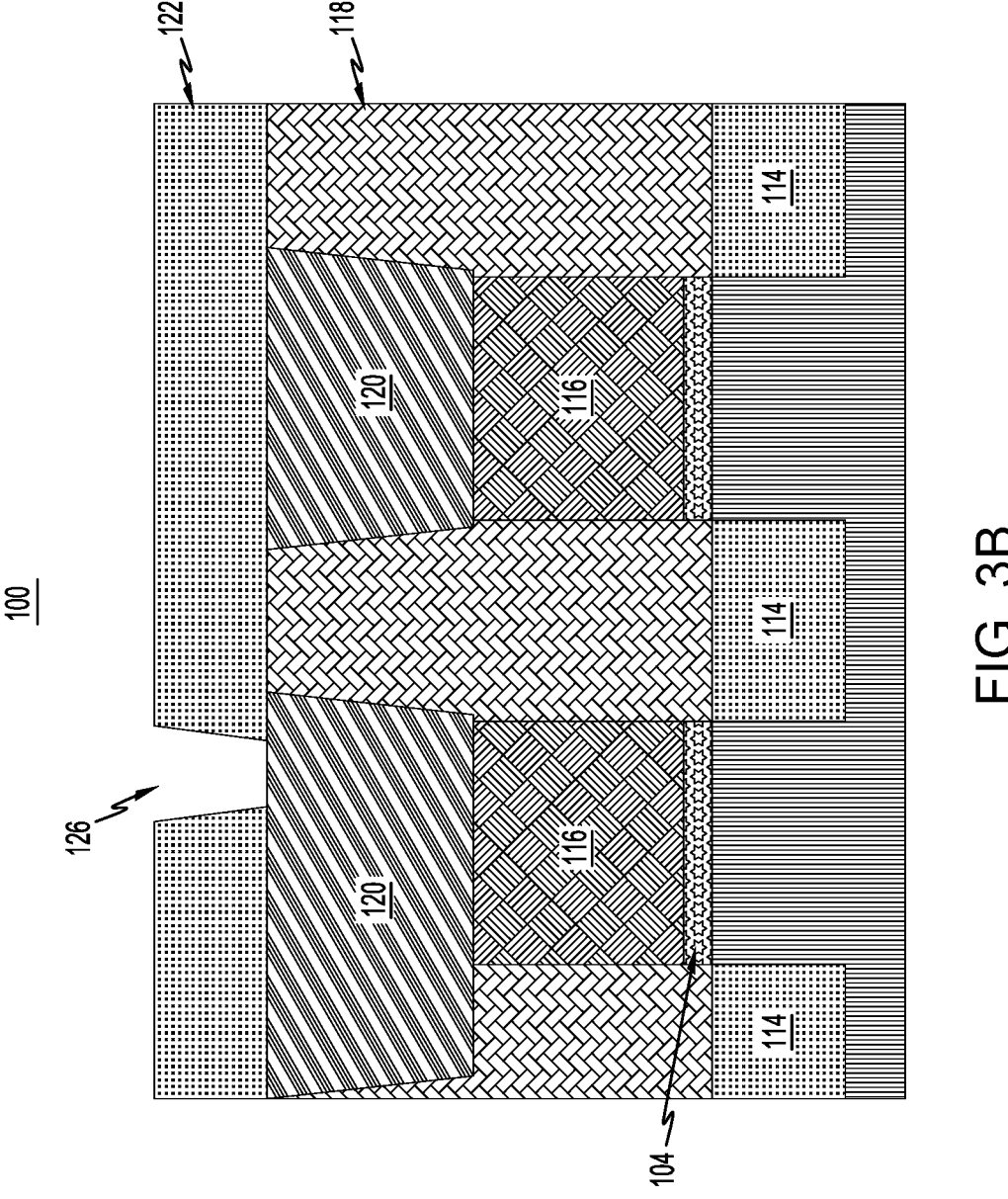
FIG. 3B is a cross-sectional view illustrating the semiconductor structure taken along the Y-Y axis of FIG. 1A at the third-intermediate fabrication stage, according to an illustrative embodiment.

FIGS. 3A and 3B illustrate semiconductor structure 100 at a third-intermediate fabrication stage. During this stage, gate contact via and trench patterning is performed to form gate contact via 124 and gate contact trench 126. For example, an additional ILD layer 122 is deposited on the top surface of ILD layer 118 and source/drain contacts 120. Gate contact via 124 and gate contact trench 126 can be formed by patterning ILD layer 122 and utilizing conventional lithographic and etching processes. Gate contact trench 126 is etched to expose a top surface of two adjacent source/drain contacts 120. Thus, gate contact trench 126 will have width greater than the width of gate contact via 124. ILD layer 122 can be of a similar material and deposited in a similar manner as ILD layer 118.

Figure 4A:
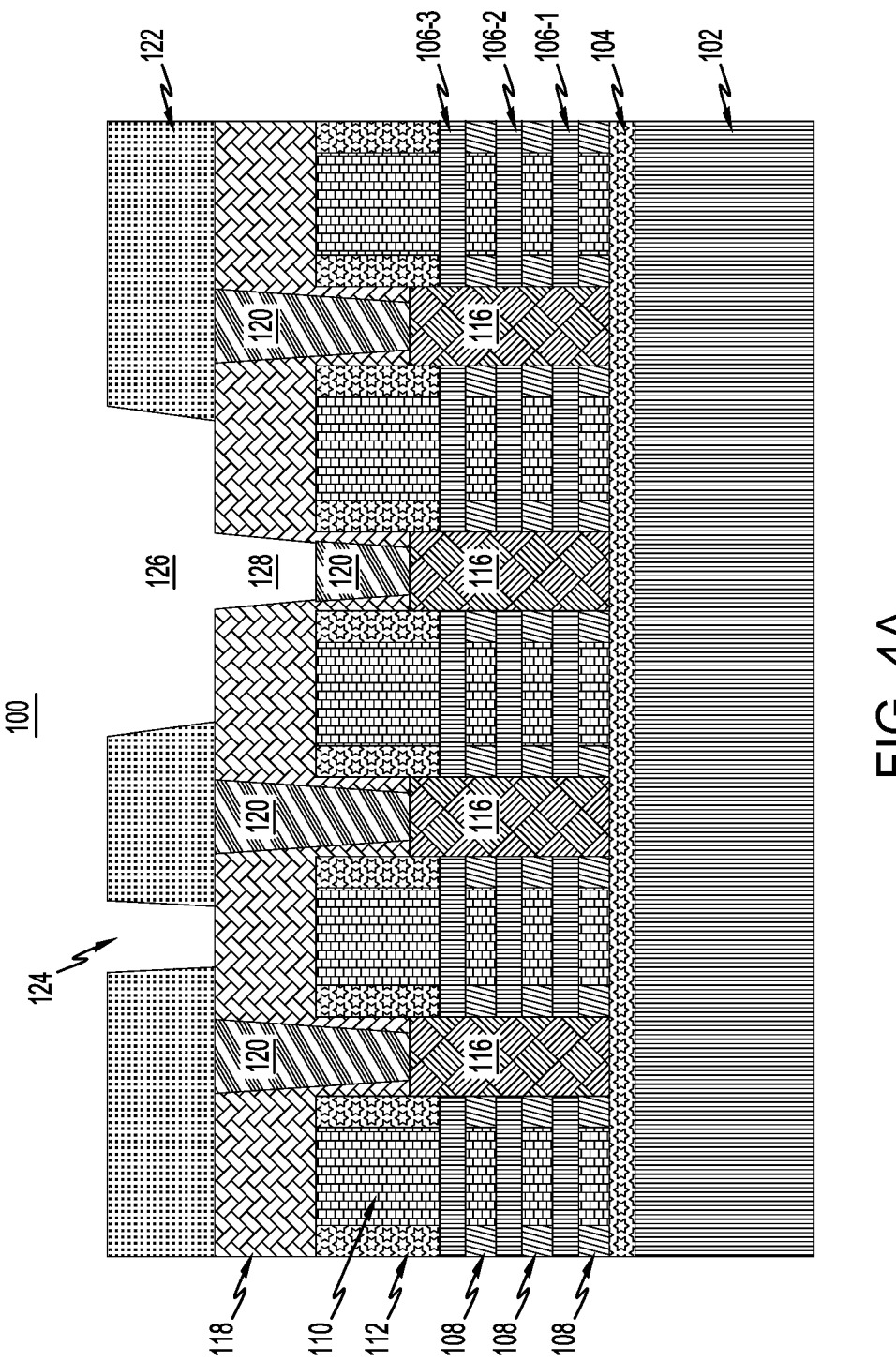
FIG. 4A is a cross-sectional view illustrating the semiconductor structure taken along the X-X axis of FIG. 1A at a fourth-intermediate fabrication stage, according to an illustrative embodiment.
Figure 4B:
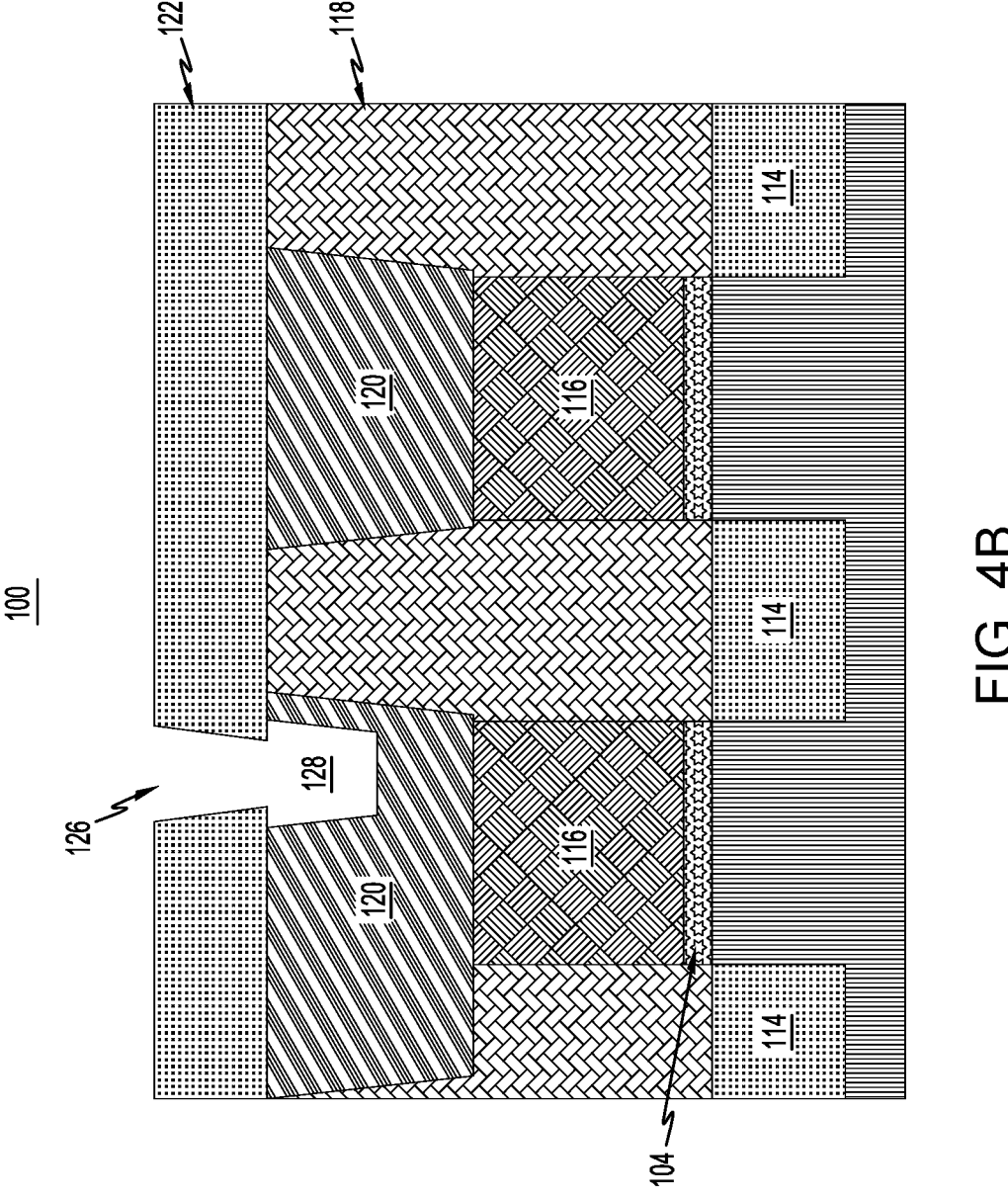
FIG. 4B is a cross-sectional view illustrating the semiconductor structure taken along the Y-Y axis of FIG. 1A at the fourth-intermediate fabrication stage, according to an illustrative embodiment.

FIGS. 4A and 4B illustrate semiconductor structure 100 at a fourth-intermediate fabrication stage. During this stage, an etch is performed to recess the exposed source/drain contact 120 in gate contact trench 126 to form via 128 according to FIG. 4A, and to recess the exposed ILD layer 118 to form via 128 according to FIG. 4B, using any suitable wet or dry etching technique.

Figure 5A:
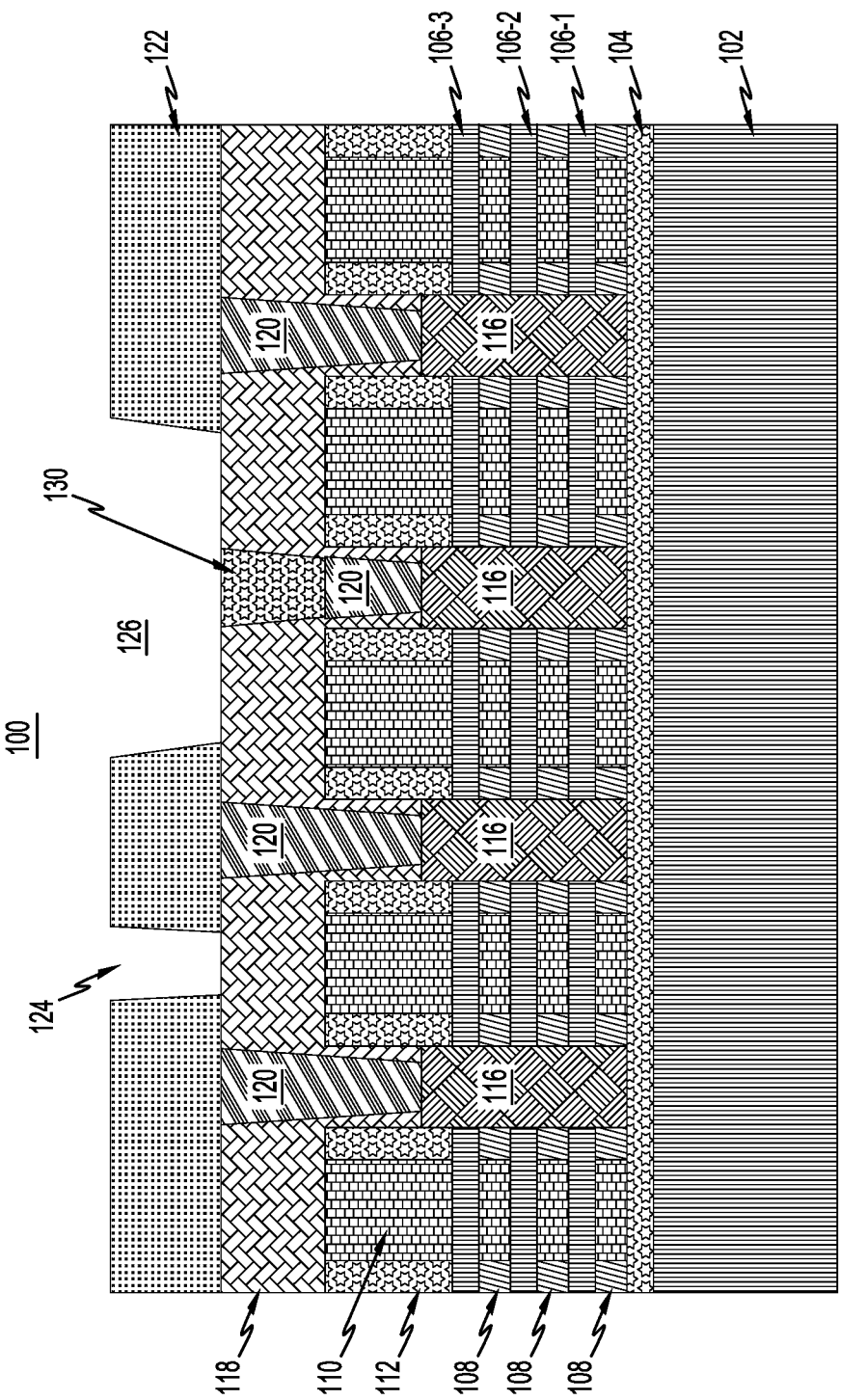
FIG. 5A is a cross-sectional view illustrating the semiconductor structure taken along the X-X axis of FIG. 1A at a fifth-intermediate fabrication stage, according to an illustrative embodiment.
Figure 5B:
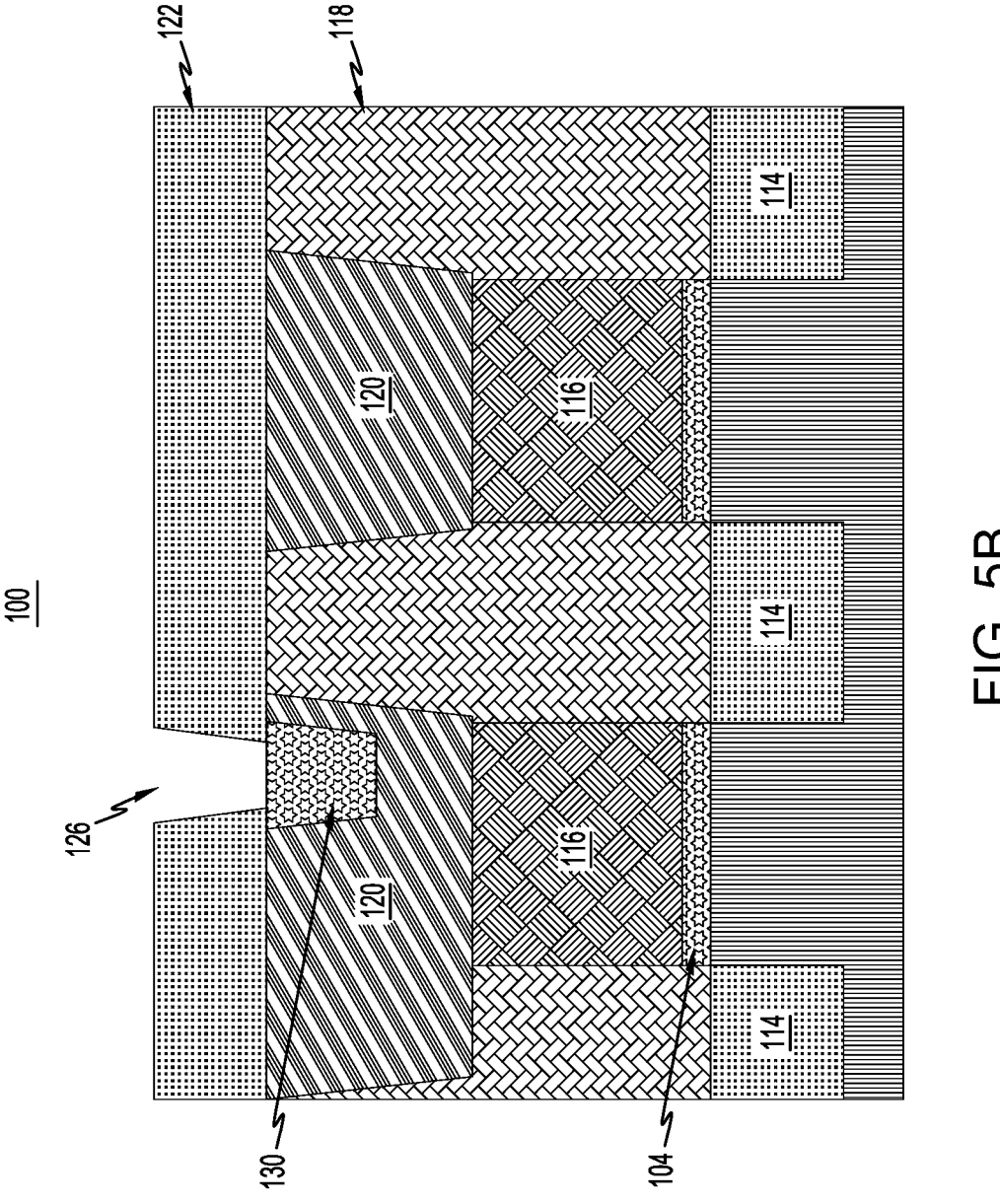
FIG. 5B is a cross-sectional view illustrating the semiconductor structure taken along the Y-Y axis of FIG. 1A at the fifth-intermediate fabrication stage, according to an illustrative embodiment.

FIGS. 5A and 5B illustrate semiconductor structure 100 at a fifth-intermediate fabrication stage. During this stage, a dielectric cap 130 is formed by depositing a dielectric material in the via 128 and filling the via, followed by recessing or other suitable processes (e.g., a combination of CMP and recess). A suitable material for dielectric cap 130 may be, for example, a dielectric material such as SiN, $SiO_2$, SiOC, SiOCN, SiBCN, SiC, etc. In one illustrative embodiment, FIG. 5B shows dielectric cap 130 having a width in an upper portion that is greater than the width of the lower portion.

Figure 6A:
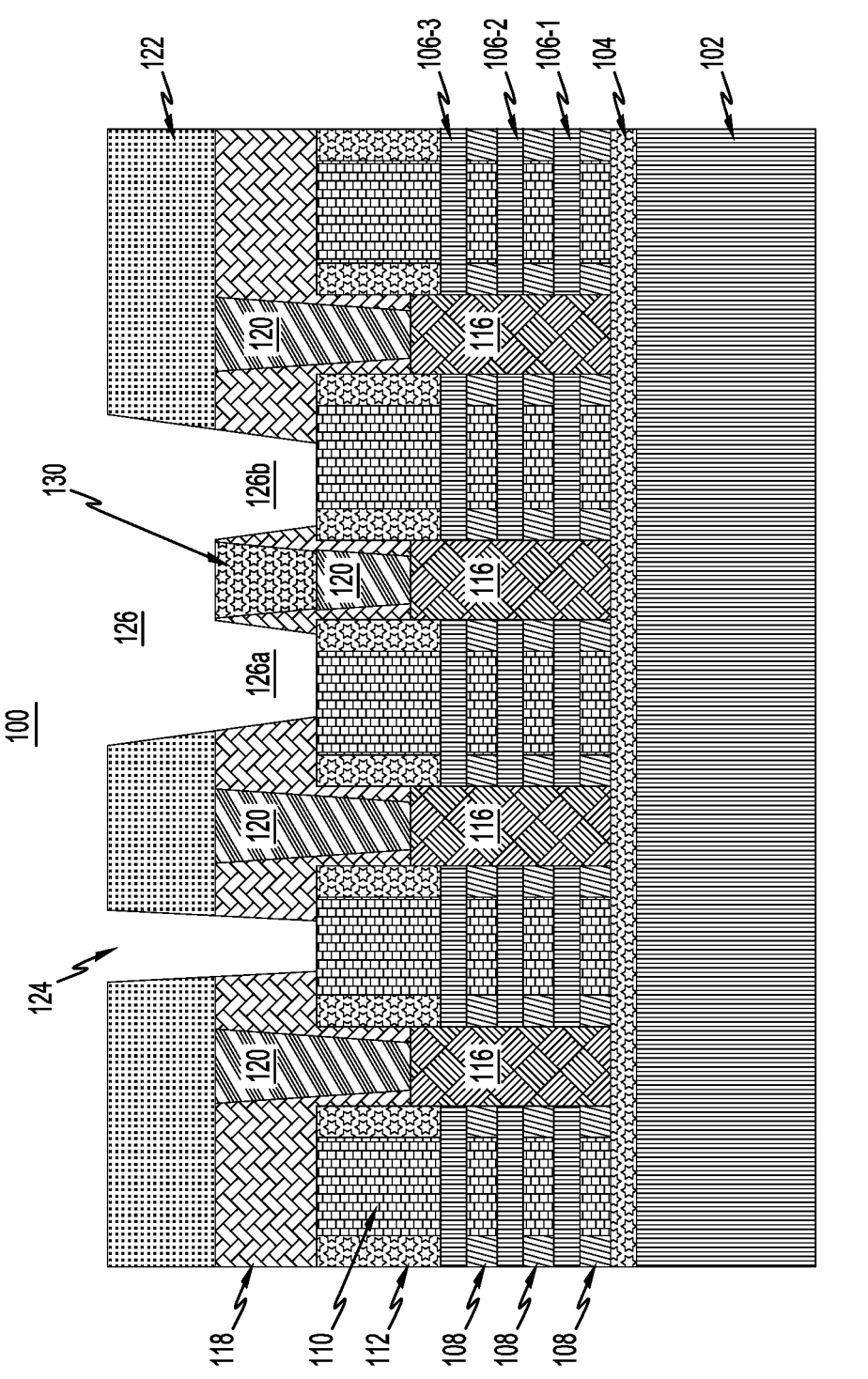
FIG. 6A is a cross-sectional view of the semiconductor structure taken along the X-X axis of FIG. 1A at a sixth-intermediate fabrication stage, according to an illustrative embodiment.
Figure 6B:
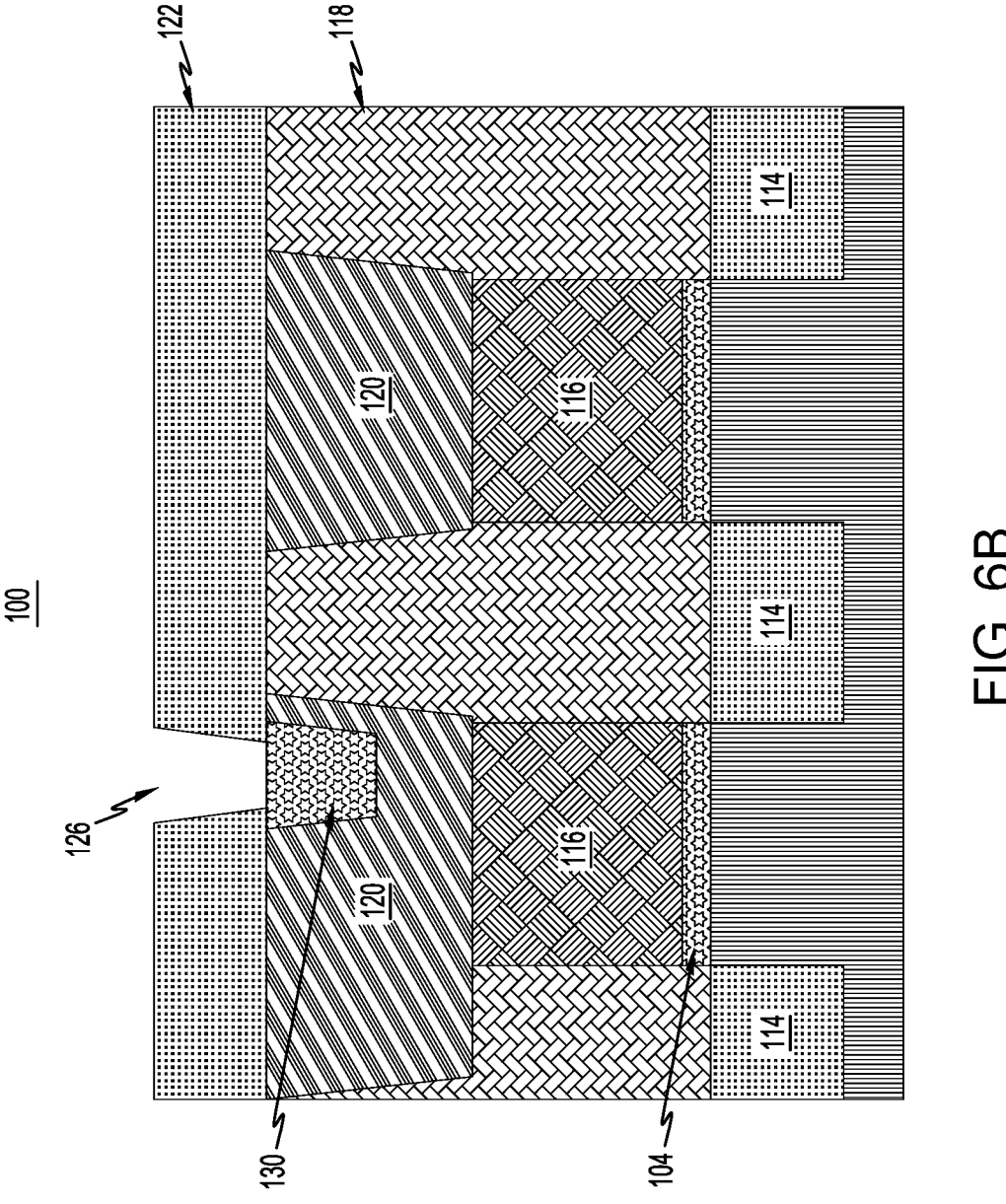
FIG. 6B is a cross-sectional view of the semiconductor structure taken along the Y-Y axis of FIG. 1A at the sixth-intermediate fabrication stage, according to an illustrative embodiment.

FIGS. 6A and 6B illustrate semiconductor structure 100 at a sixth-intermediate fabrication stage. During this stage, gate contact via 124 is extended by further selectively etching ILD layer 118. Gate contact via 124 is etched to expose a top surface of gate stack layer 110. In addition, gate contact trench 126 is further extended by further selectively etching ILD layer 118, with respect to dielectric cap 130, to form gate contact vias 126*a* and 126*b*. Gate contact vias 126*a* and 126*b* are etched to expose a top surface of two adjacent gate stack layers 110.

Figure 7A:
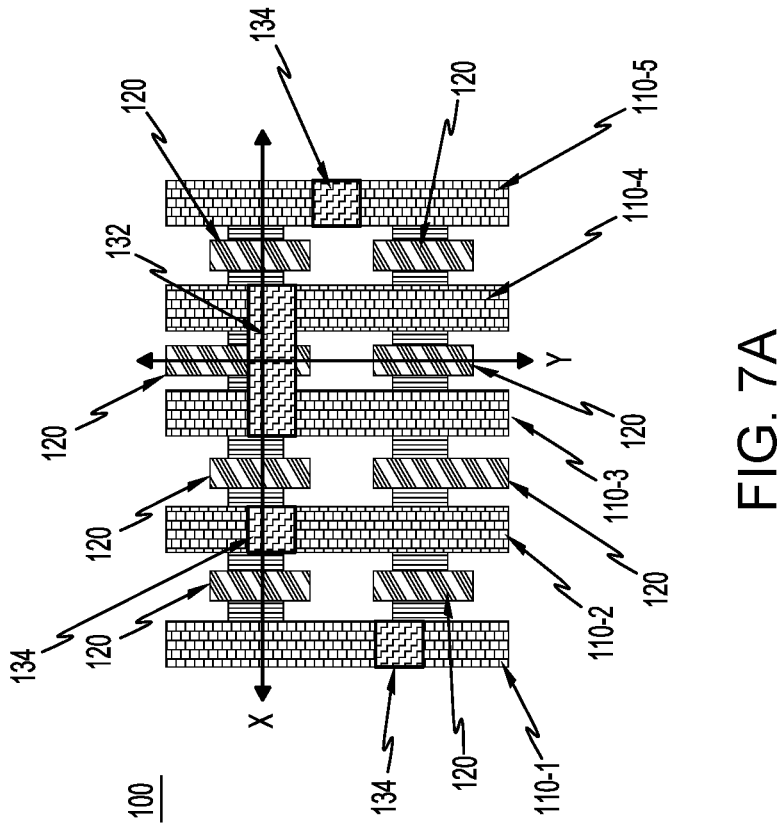
FIG. 7A is a top view illustrating a semiconductor structure for use at a seventh-intermediate fabrication stage, according to an illustrative embodiment.
Figure 7B:
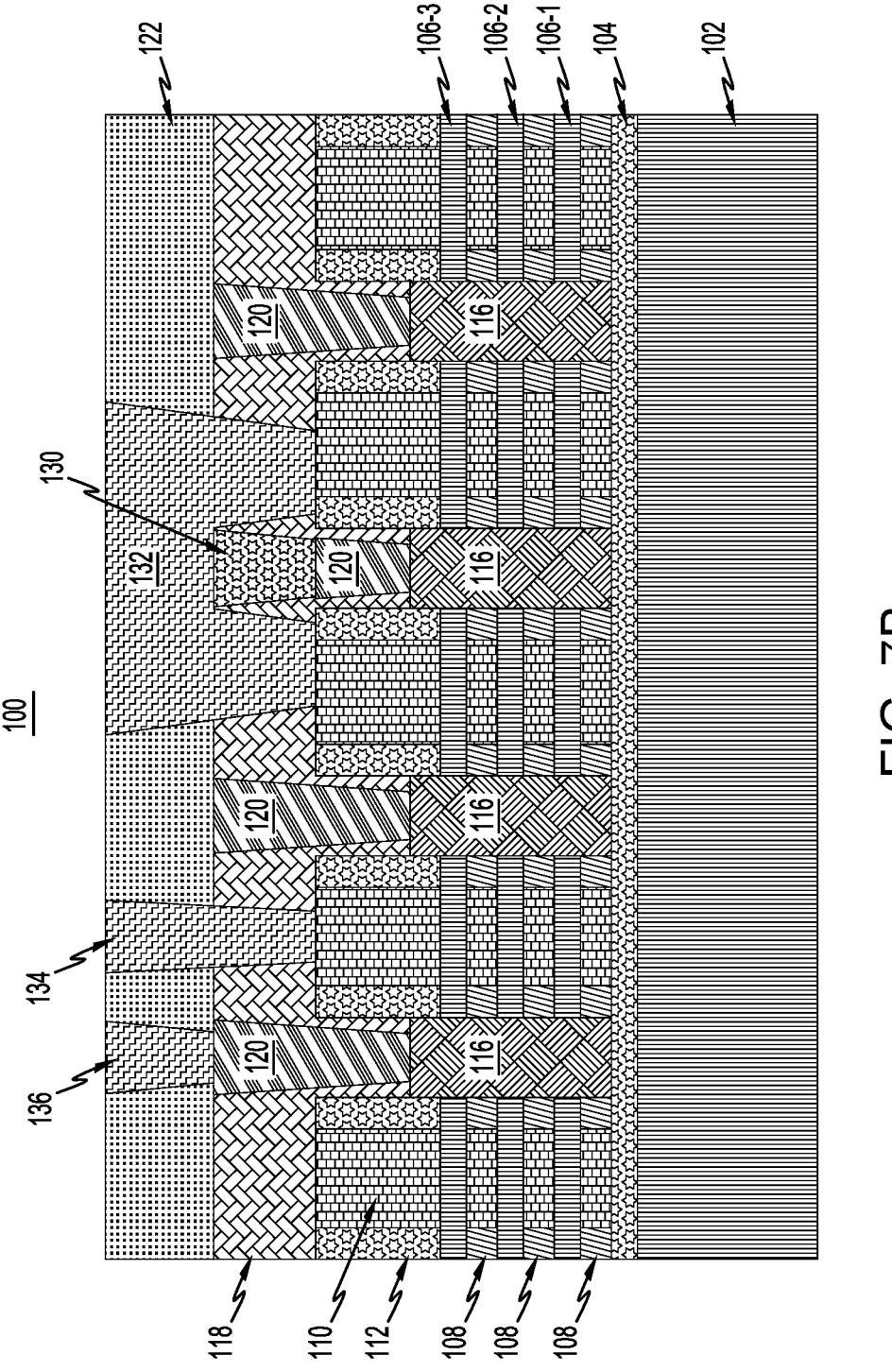
FIG. 7B is a cross-sectional view illustrating the semiconductor structure taken along the X-X axis of FIG. 7A at the seventh-intermediate fabrication stage, according to an illustrative embodiment.
Figure 7C:
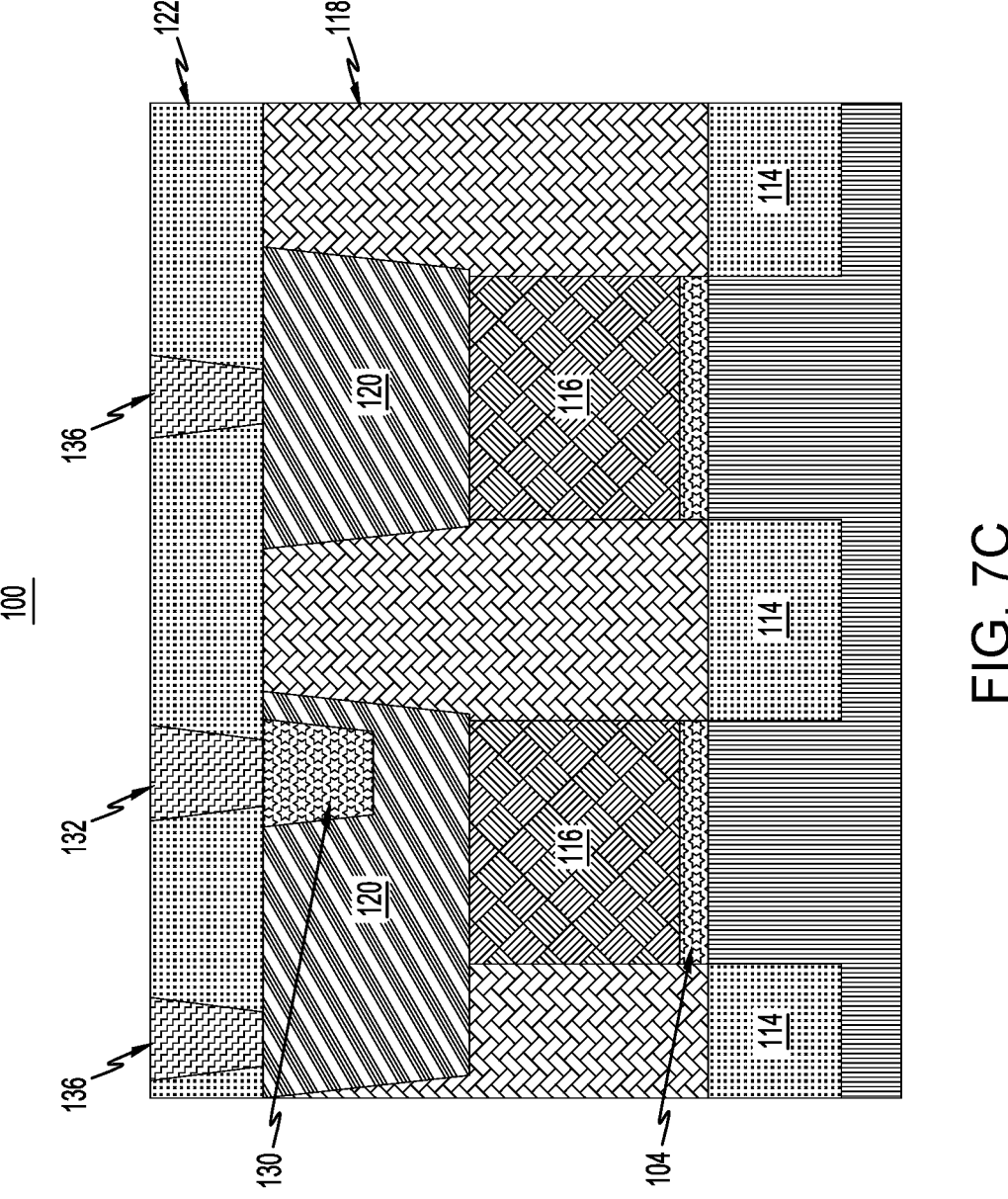
FIG. 7C is a cross-sectional view illustrating the semiconductor structure taken along the Y-Y axis of FIG. 7A at the seventh-intermediate fabrication stage, according to an illustrative embodiment.

FIGS. 7A-7C illustrate semiconductor structure 100 at a seventh-intermediate fabrication stage. During this stage, additional contact vias 136 are formed over source/drain contact 120 by conventional lithographic and etching processes. Next, a metal fill is then deposited in gate contact via 124 and gate contact trench 126 including vias 126*a* and 126*b* for the contact vias 136, gate contact trenches 134, and gate contact jumper 132 (comprising gate contact trench 126, and gate contact vias 126*a* and 126*b*). Suitable metals for the metal fill include an adhesion liner such as TiN or TaN, and conductive material such as, for example, tungsten (W), aluminum (Al), copper (Cu), cobalt (Co), nickel (Ni), titanium (Ti), ruthenium (Ru), molybdenum (Mo), or any other suitable conductive material. and the metal fills can be planarized by any planarizing process such as CMP. Other planarization processes can include grinding and polishing.

In illustrative embodiments, FIG. 7C shows dielectric cap 130 only formed locally under gate contact jumper 132. In illustrative embodiments, the gate contact jumper 132 is substantially aligned to dielectric cap 130 such that gate contact jumper 132 and dielectric cap 130 are centered with each other. Thus, the gate contact jumper 132 is centrally located on the dielectric cap 130. In addition, the width of the bottom portion of gate contact jumper 132 is less than the width of the top surface of dielectric cap 130. Thus, the bottom surface of gate contact jumper 132 is fully located on the top surface of dielectric cap 130.

It is to be understood that the semiconductor devices and methods for forming same in accordance with embodiments described herein can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metaloxide-semiconductor transistors, diodes, capacitors, inductors, etc. An integrated circuit in accordance with non-limiting illustrative embodiments can be employed in applications, hardware, and/or electronic systems.

Suitable hardware and systems for implementing the non-limiting illustrative embodiments may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the non-limiting illustrative embodiments provided herein, one of ordinary skill in the art will be able to contemplate other implementations and applications of the techniques described herein.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a first source/drain contact disposed between a first gate structure and a second gate structure;
a dielectric cap disposed on the first source/drain contact;
a first gate contact disposed over the dielectric cap, the first gate contact connecting the first gate structure with the second gate structure;
a third gate structure adjacent the first gate structure;
a second gate contact disposed on the third gate structure;
a first source/drain region disposed between the first gate structure and the second gate structure;
a second source/drain region disposed between the first gate structure and the third gate structure; and
a second source/drain contact disposed on the second source/drain region,
wherein the first source/drain contact is disposed on the first source/drain region; and
wherein the second gate contact is separated from the first gate contact by a dielectric layer.

2. The semiconductor structure of claim 1, wherein the dielectric cap has a top surface extending above a top surface of the first gate structure and the second gate structure.

3. The semiconductor structure of claim 2, wherein a middle portion of the first gate contact is disposed over the dielectric cap.

4. The semiconductor structure of claim 3, wherein the first gate contact comprises a first via disposed on the first gate structure and a second via disposed on the second gate structure.

5. The semiconductor structure of claim 4, wherein the first via and the second via of the first gate contact are disposed in a first interlayer dielectric layer, and the middle portion of the first gate contact is disposed in a second interlayer dielectric layer.

6. The semiconductor structure of claim 1, wherein the dielectric cap has a top surface extending above a top surface of the first gate structure and the second gate structure, and a middle portion of the first gate contact is disposed over the dielectric cap.

7. The semiconductor structure of claim 1, further comprising:
  a fourth gate structure adjacent the second gate structure;
  a third source/drain region disposed between the fourth gate structure and the second gate structure; and
  a third source/drain contact disposed on the third source/drain region.

8. The semiconductor structure of claim 1, wherein the dielectric cap comprises a dielectric material selected from the group consisting of SiN, $SiO_2$, SiOC, SiOCN, SiBCN and SiC.

9. The semiconductor structure of claim 1, wherein the first source/drain region and the second source/drain region are disposed between a first stack of nanosheet channel layers.

10. The semiconductor structure of claim 9, wherein the second source/drain region is disposed between the first stack of nanosheet channel layers and a second stack of nanosheet channel layers.

11. The semiconductor structure of claim 10, wherein the first stack of nanosheet channel layers and the second stack of nanosheet channel layers are disposed on a bottom dielectric insulator layer.

12. A semiconductor structure, comprising:
  a first source/drain contact disposed between a first gate structure and a second gate structure;
  a dielectric cap disposed on the first source/drain contact, the dielectric cap extending above a top surface of the first gate structure and the second gate structure;
  a gate contact jumper connecting the first gate structure with the second gate structure, wherein a portion of the gate contact jumper is disposed over the dielectric cap:
  a third gate structure adjacent the first gate structure; and
  a gate contact disposed on the third gate structure;
  a first source/drain region disposed between the first gate structure and the second gate structure;
  a second source/drain region disposed between the first gate structure and the third gate structure; and a second source/drain contact disposed on the second source/drain region;
  wherein the first source/drain contact is disposed on the first source/drain region; and
  wherein the gate contact is separated from the gate contact jumper by a dielectric layer.

13. The semiconductor structure of claim 12, wherein a middle portion of the gate contact jumper is disposed over the dielectric cap.

14. The semiconductor structure of claim 13, wherein the gate contact jumper comprises a first via disposed on the first gate structure and a second via disposed on the second gate structure.

15. The semiconductor structure of claim 14, wherein the first via and the second via of the gate contact jumper are disposed in a first interlayer dielectric layer, and the middle portion of the gate contact jumper is disposed in a second interlayer dielectric layer.

16. The semiconductor structure of claim 12, further comprising:
  a fourth gate structure adjacent the second gate structure;
  a third source/drain region disposed between the fourth gate structure and the second gate structure; and
  a third source/drain contact disposed on the third source/drain region.

17. The semiconductor structure of claim 12, wherein the dielectric cap comprises a dielectric material selected from the group consisting of SiN, $SiO_2$, SiOC, SiOCN, SiBCN and SiC.

18. The semiconductor structure of claim 12, wherein the first source/drain region and the second source/drain region are disposed between a first stack of nanosheet channel layers.

19. The semiconductor structure of claim 18, wherein the second source/drain region is disposed between the first stack of nanosheet channel layers and a second stack of nanosheet channel layers.

20. The semiconductor structure of claim 19, wherein the first stack of nanosheet channel layers and the second stack of nanosheet channel layers are disposed on a bottom dielectric insulator layer.

* * * * *